United States Patent [19]
Hauselt et al.

[11] Patent Number: 6,024,583
[45] Date of Patent: Feb. 15, 2000

[54] MODULE FOR CONNECTING AN ACTUATOR OR SENSOR

[75] Inventors: Peter Hauselt, Poppenricht; Manfred Breitkopf, Kümmersbruck, both of Germany

[73] Assignee: Siemens Aktiengesellschaft, München, Germany

[21] Appl. No.: 09/018,172

[22] Filed: Feb. 3, 1998

[30] Foreign Application Priority Data

Feb. 3, 1997 [DE] Germany .................. 297 01 828 U

[51] Int. Cl.⁷ ...................................... H01R 9/09
[52] U.S. Cl. .......................................... 439/76.1; 439/505
[58] Field of Search ..................... 439/505, 76.1, 439/52, 49, 55; 200/51.05

[56] References Cited

U.S. PATENT DOCUMENTS

| | | |
|---|---|---|
| 4,655,520 | 4/1987 | Cummings . |
| 5,501,611 | 3/1996 | Staiger et al. ............... 439/404 |
| 5,722,852 | 3/1998 | Miek . |

FOREIGN PATENT DOCUMENTS

| | | |
|---|---|---|
| 0 283 013 | 9/1988 | European Pat. Off. . |
| 0 695 468 | 2/1996 | European Pat. Off. . |
| 2 723 480 | 2/1996 | France . |
| 1 765 512 | 12/1971 | Germany . |
| 40 34 385 | 4/1992 | Germany . |
| 43 20 327 | 6/1994 | Germany . |
| 94 16 127.5 | 1/1995 | Germany . |
| 94 00 326.2 | 6/1995 | Germany . |
| 43 05 544 | 8/1995 | Germany . |
| 44 12 783 | 10/1995 | Germany . |
| 1 95 04 013 | 7/1996 | Germany . |
| WO 94/24725 | 10/1994 | WIPO . |
| WO 94/24727 | 10/1994 | WIPO . |
| WO 94/24728 | 10/1994 | WIPO . |
| WO 95/15594 | 6/1995 | WIPO . |

*Primary Examiner*—Lincoln Donovan
*Assistant Examiner*—J. F. Duverne
*Attorney, Agent, or Firm*—Kenyon & Kenyon

[57] ABSTRACT

A module for making an actuator or sensor of any design accessible to a bus. The module is provided with a device connection to which the device can be directly coupled. The module has electronics on a printed-circuit board, which is connected to the contact pins for contacting a bus line.

2 Claims, 4 Drawing Sheets

MODULE FOR CONNECTING AN ACTUATOR OR SENSOR

FIELD OF THE INVENTION

The invention relates to a module for connecting an actuator or sensor to a bus.

BACKGROUND INFORMATION

PCT Pub. No. WO 94/24725 discloses a module having a plurality of clamp-screw-type terminals as subscribers' outgoing circuits, which enable actuators and sensors to be connected to electronics in the module housing by way of plug connectors having integral leads. These electronics, provided for exchanging data over a bus line, are able to be connected to the bus line via a contact device with the aid of a line-connecting basket-type configuration. For this purpose, the housing, constructed in multiple parts, must be opened, and the bus line for contacting must be installed in the line-connecting basket-type configuration. The electronics, in this case, are adapted to the maximum number of subscribers.

German Patent No. 43 20 327 C1 describes the integration of electronics used for data exchange, by way of a bus line, into individual actuators and sensors, and the provision of a contact device for connecting the bus line.

SUMMARY OF THE INVENTION

The object of the invention is to make individual actuators and sensors of any construction type accessible to a bus without internal intervention.

DETAILED DESCRIPTION OF THE INVENTION

Figure 1:
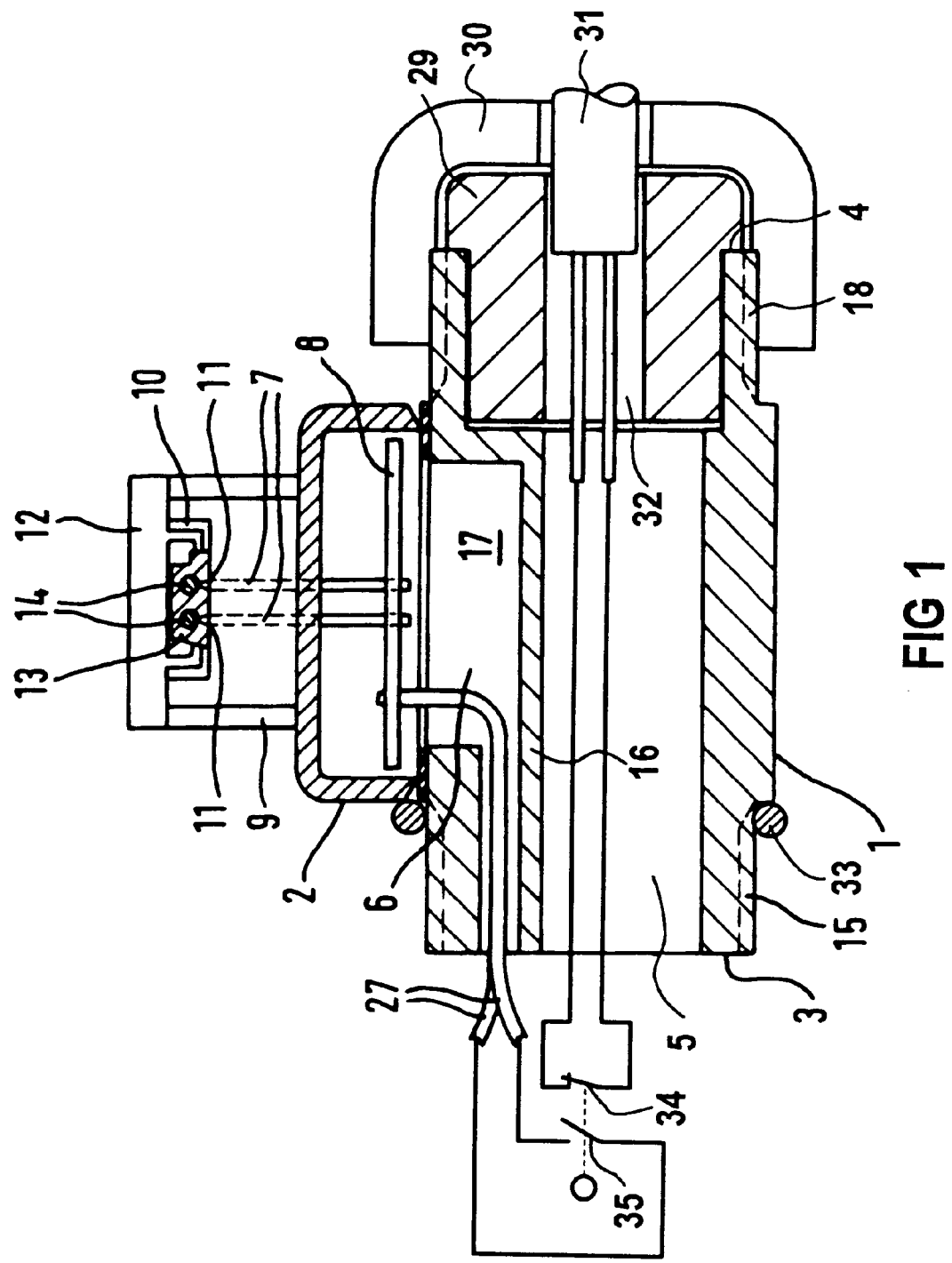
FIG. 1 illustrates a longitudinal section of a module in accordance with the present invention.

FIG. 1 illustrates an exemplary module of the present invention for connecting an actuator or sensor as a subscriber. As shown, the module is assembled from a housing connection part 1 and a communications part 2. Housing connection part 1 is cylindrical in shape and has a feed-through opening 5 between its two end faces 3,4. On its longitudinal side, housing connection part (or device connection part) 1 is provided with an opening 6, which is covered by communications part 2 placed thereon.

Communications part 2 comprises a contact device having contact pins 7 and a printed-circuit board 8, onto which contact pins 7 are soldered at their extremities. Communications part 2 comprises a connection block 9 having a recess (or cut-out) 10 in the housing, which is provided with openings 11 permitting contact pins 7 to pass through into the space formed by recess 10. Disposed in recess 10 is a form-coded (form-oriented) bus line 13, which is retained in a cover 12 that is adapted to the form coding. Contact pins 7 contact line conductors 14 of form-coded bus line 13.

End face 3 of housing connection part 1 is provided with a device connector 15 designed to enable the housing of an actuator or sensor to be directly coupled thereto. This can be, for example, a position switch or a proximity switch. Device connector 15 can be designed, for example, as a threaded connection, as a flange plug-in connector, or as a press-fit connector. A signal lead 27 can be run from printed-circuit board 8, preferably through a cavity 17 separated from feed-through opening 5 by a partition wall 16, to be connected to the actuator or sensor. At opposite end face 4 of housing connection part 1, there is a cable connection 18, e.g., for a screw-down nut (or forcing nut) 30 having a rubber grommet 29, which has an opening 32. In this way, the safety circuit can be connected to the actuator or sensor via device coupler 31.

Disposed in the sensor or actuator coupled to the device connector are at least one break contact 34 and at least one make contact 35. The make contact is connected to signal lead 27, by way of which the condition of the actuator or sensor is queried. A corresponding signal is transmitted over bus line 13 to a higher-level control unit.

Break contact 34 is connected, as a safety contact, to a consumer (or load) via device coupler 31.

Figure 2:
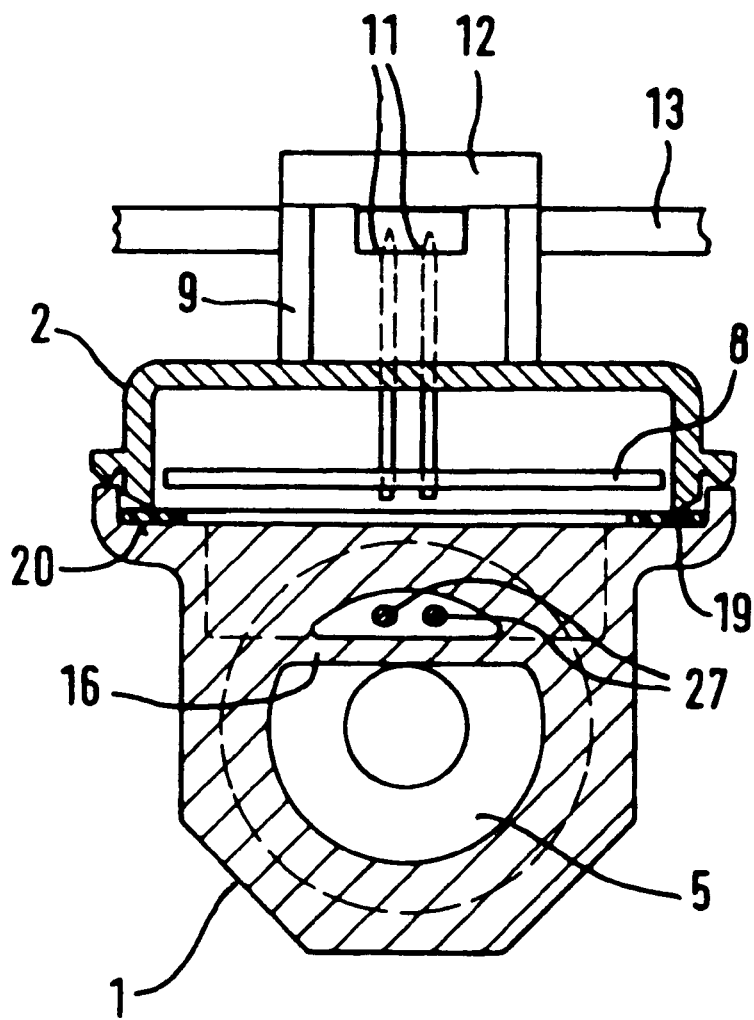
FIG. 2 shows a cross-sectional view of the module of FIG. 1.

FIG. 2 shows a cross-sectional view of the module of the present invention, in accordance with FIG. 1, having the design described above. The connection of communications part 2 to housing connection part 1 can be constituted, e.g., as a screw-, weld-, or snap-on connection. To satisfy the type of protection required by VDE 0470, e.g., JP-67, or adequate seal tightness, it is expedient to provide a seal (or gasket) 19 between the two components. This seal can be injected into a groove 20 of housing connection part 1.

Figure 3:
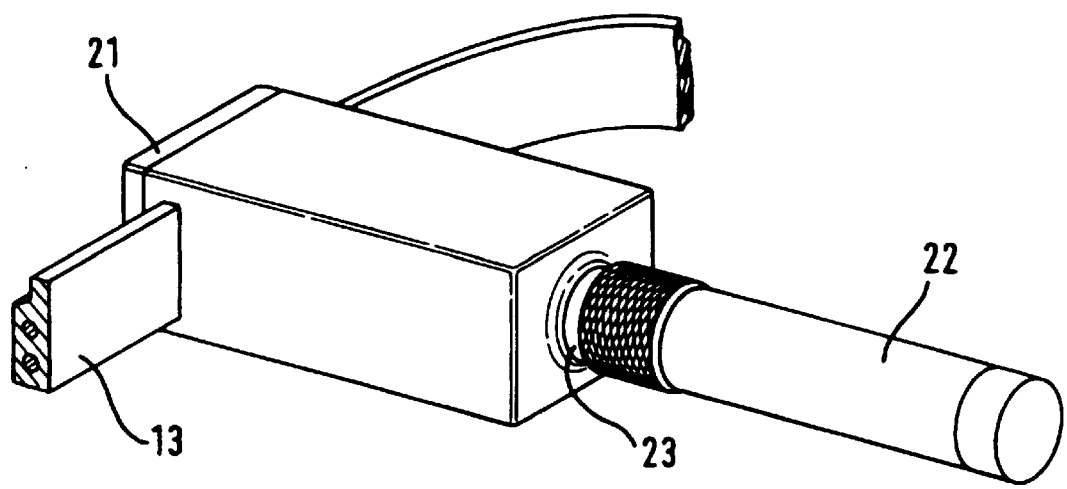
FIG. 3 shows a module in accordance with the present invention in cuboid form having a direct device coupler.

Provision is made for a seal 33 and, at connection 18, for a rubber grommet 29 to fulfill the type of protection required on device connector 15. Given the cuboid design of the module in FIG. 3, on the one end face, a contact device is provided for a form-coded bus line 13, which is retained by a bracket 21. At the other end face, a non-contact proximity switch 22 is directly connected, as a sensor, via a screw-type connection. For this purpose, the module has a plug, fitted to the sensor, or a screw-type connection 23 having a thread. As already described above, disposed in the module is a printed-circuit board having the electronics necessary for data transfer between the bus line and the sensor.

Figure 4:
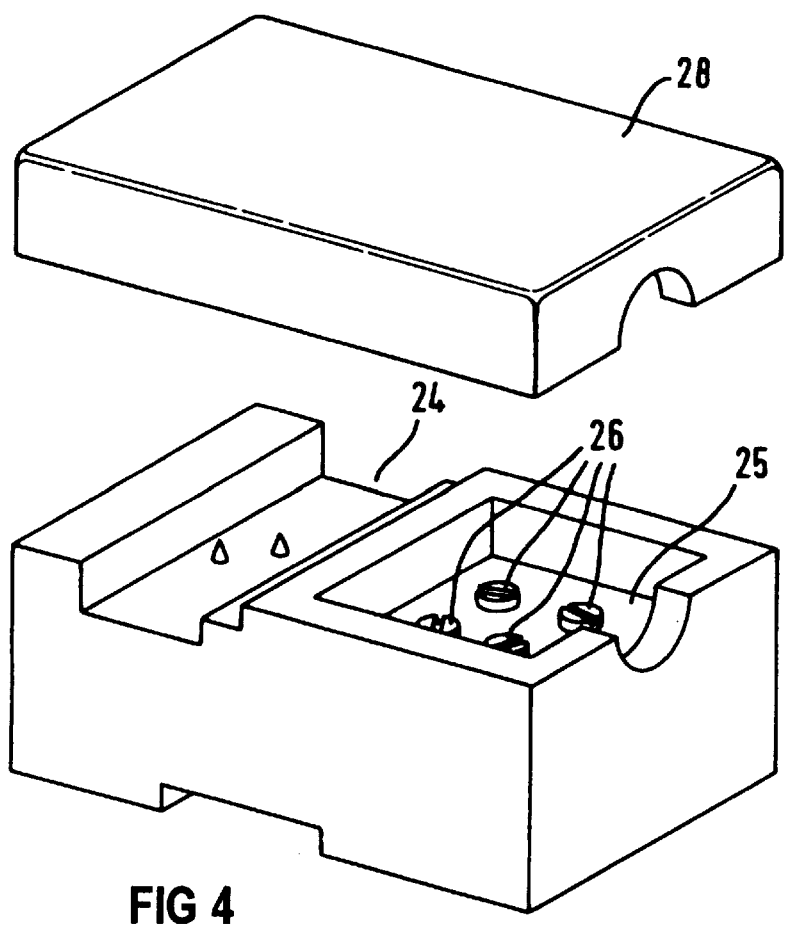
FIG. 4 shows a module having a terminal compartment (or wiring space) for one or a plurality of subscribers.

FIG. 4 shows a module capable of being snap fit, e.g., onto a top-hat rail, with a contact device, the housing being provided, in turn, with a recess 24 for receiving a bus line. A further recess 25 having contacts 26 on the housing is used for connecting a sensor or actuator. After a connection is made, recesses 24, 25 are sealingly covered by a cover 28, in accordance with the required type of protection.

Figure 5:
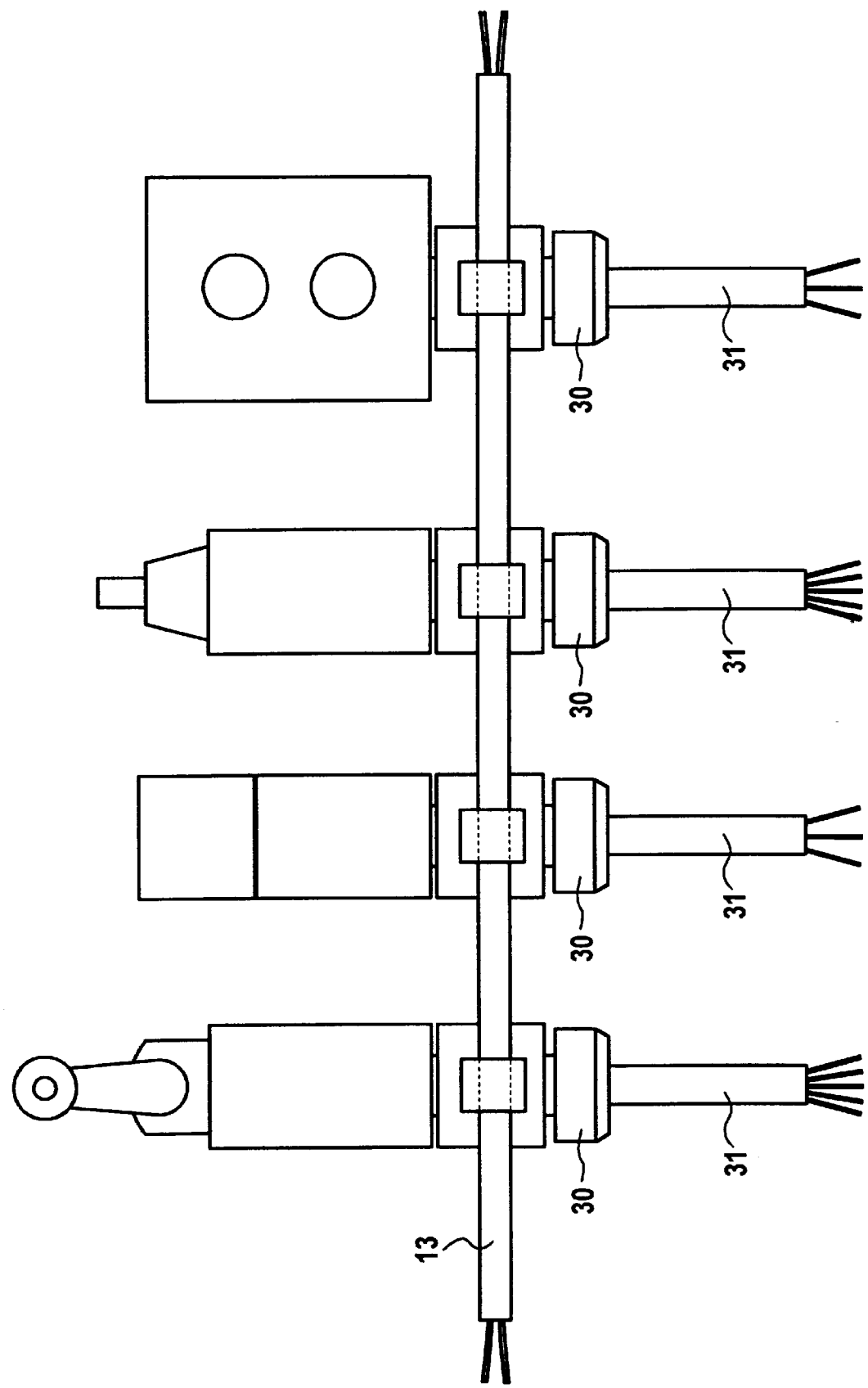
FIG. 5 shows exemplary modules in accordance with the present invention for connecting actuators and sensors.

FIG. 5 shows the connection of a plurality of actuators and sensors to bus line 13, e.g., position switches, proximity switches, or encapsulations.

What is claimed is:

1. A module comprising:

a device connection part having a first device connection for coupling to one of an actuator and a sensor, the device connection part further including a cable connection for coupling a device connection line, the device connection line functioning as a voltage supply of the one of the actuator and the sensor, the device connection line being accommodated in a through opening between the device connection part and the cable connection;

a communications part adapted to the device connection part, the communications part including a contacting device having contact ends for contacting a bus conductor, and a printed circuit board having electronics for providing data exchange between the bus conductor and the one of the actuator and sensor; and a signal line extending from the communications part to the first device connection functioning for the connection to the one of the actuator and the sensor.

2. The module according to claim 1, wherein the cable connection includes a form-fitting seal for sealing the cable connection to the device connection part, and a clamp acting on the form-fitting seal.

* * * * *